United States Patent
Takeda et al.

(10) Patent No.: US 11,527,059 B2
(45) Date of Patent: Dec. 13, 2022

(54) RESERVOIR COMPUTING

(71) Applicant: INTERNATIONAL BUSINESS MACHINES CORPORATION, Armonk, NY (US)

(72) Inventors: Seiji Takeda, Tokyo (JP); Toshiyuki Yamane, Kanagawa-ken (JP); Daiju Nakano, Kanagawa-ken (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 421 days.

(21) Appl. No.: 16/775,008

(22) Filed: Jan. 28, 2020

(65) Prior Publication Data

US 2021/0232910 A1 Jul. 29, 2021

(51) Int. Cl.
| | |
|---|---|
| G06V 10/82 | (2022.01) |
| G06N 3/08 | (2006.01) |
| G01N 21/65 | (2006.01) |
| H01S 5/068 | (2006.01) |
| G06K 9/62 | (2022.01) |
| H03M 1/12 | (2006.01) |
| G06V 10/774 | (2022.01) |
| G06V 10/778 | (2022.01) |

(52) U.S. Cl.
CPC ............ *G06V 10/82* (2022.01); *G01N 21/65* (2013.01); *G06K 9/6257* (2013.01); *G06K 9/6264* (2013.01); *G06N 3/08* (2013.01); *G06V 10/7747* (2022.01); *G06V 10/7788* (2022.01); *H01S 5/06804* (2013.01); *H03M 1/12* (2013.01)

(58) Field of Classification Search
CPC .......... G06N 3/08; G06N 3/067; G01N 21/65; H01S 5/06804; H03M 1/12; G06V 10/7747; G06V 10/7788; G06V 10/82; G06K 9/6257; G06K 9/6264

See application file for complete search history.

(56) References Cited

U.S. PATENT DOCUMENTS

| | | |
|---|---|---|
| 9,852,372 B1 | 12/2017 | Nakano et al. |
| 2010/0098116 A1* | 4/2010 | Bhatia .................. H04N 9/3129 372/10 |
| 2018/0293495 A1* | 10/2018 | Okumura ................. G06N 3/04 |
| 2018/0309266 A1 | 10/2018 | Nakano et al. |
| 2019/0205742 A1 | 7/2019 | Takeda et al. |

(Continued)

OTHER PUBLICATIONS

Grace Period Disclosure: Reservoir Computing by Micro Photonic Structures, Seiji Takeda, Journal of Institute of Electronics, Information and Communication Engineers (IEICE), vol. 102, No. 2, (Feb. 1, 2019), pp. 134-139.

(Continued)

*Primary Examiner* — Daniel G Mariam
(74) *Attorney, Agent, or Firm* — Tutunjian & Bitetto, P.C.; Randy Emilio Tejeda

(57) ABSTRACT

Provided is a reservoir computing system including a reservoir having a random laser for emitting a non-linear optical signal with respect to an input signal. The reservoir computing system also includes a converter for converting the non-linear optical signal into an output signal by applying a conversion function. The conversion function is trained by using a training input signal and a target output signal.

24 Claims, 8 Drawing Sheets

(56) References Cited

U.S. PATENT DOCUMENTS

2020/0131025 A1* 4/2020 Sinha .................. G06N 3/0635

OTHER PUBLICATIONS

Nakayama, Joma, et al., "Laser dynamical reservoir computing with consistency: an approach of a chaos mask signal," Optics express, Apr. 2016, pp. 8769-8692, 24.8.

Rohm, Andre, et al., "Reservoir computing using laser networks," IEEE Journal of Selected Topics in Quantum Electronics, Jul. 2019, pp. 1-8, 26.1.

Brunner, Daniel, et al., "Parallel photonic information processing at gigabyte per second data rates using transient states," Nature communications, Jan. 2013, pp. 1-7, 4.1.

Takeda, Seiji, et al., "Photonic reservoir computing based on laser dynamics with external feedback," International Conference on Neural Information Processing, Oct. 2016, pp. 222-230.

Tureci, H.E., et al., "Strong interactions in multimode random lasers," Science, May 2008, pp. 643-646, 320.5876.

Sebbah, P., et al., "Random laser in the localized regime," Physical Review B, Oct. 2002, 3 pages, 66.14.

Jiang, Xunya, et al., "Time dependent theory for random lasers," Physical review letters, Jul. 2000, pp. 70-73, 85.1.

* cited by examiner

RESERVOIR COMPUTING

STATEMENT REGARDING PRIOR DISCLOSURES BY THE INVENTOR OR A JOINT INVENTOR

The following disclosure(s) are submitted under 35 U.S.C. § 102(b)(1)(A): DISCLOSURE(S): Reservoir Computing by Micro Photonic Structures, Seiji Takeda, Journal of Institute of Electronics, Information and Communication Engineers (IEICE), Vol. 102, No. 2, (Feb. 1, 2019), pages 134-139.

BACKGROUND

The present invention relates to reservoir computing. More specifically, the present invention relates to reservoir computing using a random laser.

A machine learning system that handles time-series data, such as for voice recognition and stock prediction, that uses a recurrent type network structure known as a reservoir is known as a reservoir computing system. Such reservoir computing systems learn weights of an output layer, without changing the weights inside the reservoir after these weights are initially set, such as at random. Therefore, it is possible to use a physical device as a reservoir if the physical device outputs a non-linear signal in response to an input signal.

In particular, photonic reservoir computing is especially useful owing to its high-speed response. However, current photonic reservoir computing systems require a laser diode (LD), an optical cable, and an external mirror that occupies a large area (order of $mm^2$ to $cm^2$). Therefore, it is desired to downscale a photonic reservoir computing system.

SUMMARY

According to an embodiment of the present invention, provided is a reservoir computing system including a reservoir including a random laser for emitting a non-linear optical signal with respect to an input signal; and a converter for converting the non-linear optical signal into an output signal by applying a conversion function. By using the random laser as a reservoir, the size of a reservoir computing system can be reduced.

The converter may include a photo detector for converting the non-linear optical signal into an electrical signal; an AD converter for converting the electrical signal detected by the photo detector into a digital signal; and a digital signal converter for converting the digital signal from the AD converter into the output signal by applying the conversion function to the digital signal. In this way, the digital signal converter can apply the conversion function by using a digital signal process, and thereby the conversion function can be more easily adjusted to the specific application of the reservoir computing system.

The reservoir computing system may further include a bias unit for adding bias to the input signal to be input to the random laser. A training apparatus trains the bias by using a training input signal and the target output signal. By training the bias of the input signal, the reservoir computing system may further improve the accuracy of prediction or estimation.

According to another embodiment of the present invention, provided is a method including supplying an input signal corresponding to an object to a reservoir having a random laser for emitting a non-linear optical signal with respect to the input signal; converting the non-linear optical signal into an output signal by applying a conversion function; and identifying the object by using the output signal. In this way, an object may be identified by using the random laser as a reservoir that may have a small size.

According to another embodiment of the present invention, provided is a training apparatus including an obtaining unit for obtaining a training input signal and a target output signal; and a supplying unit for supplying the training input signal to a reservoir computing system. The reservoir computing system includes a random laser for emitting a non-linear optical signal with respect to an input signal and a converter for converting the non-linear optical signal into an output signal by applying a conversion function. The training apparatus also includes a training unit for training the conversion function to reduce an error between the output signal and the target output signal for the training input signal. By training the conversion function of the converter, the reservoir computing system including a random laser as a reservoir can be trained to generate accurate output signals from input signals by utilizing non-linear outputs from the reservoir that may have a complex and even unknown structure.

The reservoir computing system may include a bias unit for adding bias to the input signal to be input to the random laser, and the training unit may train the bias by using the training input signal and the target output signal. By training the bias of the input signal, the reservoir computing system may further improve the accuracy of prediction or estimation.

The reservoir receives the input signal corresponding to an object and the converter may output the output signal to represent an identification of the object. A reservoir computing system including such a converter may be useful for identifying an object.

According to another embodiment of the present invention, provided is a computer-implemented method including obtaining a training input signal and a target output signal; supplying the training input signal to a reservoir computing system, wherein the reservoir computing system includes a random laser for emitting a non-linear optical signal with respect to an input signal and a converter for converting the non-linear optical signal to an output signal by applying a conversion function; and training the conversion function to reduce an error between the output signal and the target output signal corresponding to the training input signal.

According to another embodiment of the present invention, provided is a computer program product including one or more computer readable storage mediums collectively storing program instructions that are executable by a processor or programmable circuitry to cause the processor or programmable circuitry to perform operations including obtaining a training input signal and a target output signal; supplying the training input signal to a reservoir computing system, wherein the reservoir computing system includes a random laser for emitting non-linear optical signal with respect to an input signal and a converter for converting the non-linear optical signal to an output signal by applying a conversion function; and training the conversion function to reduce an error between the output signal and the target output signal corresponding to the training input signal.

DETAILED DESCRIPTION

Hereinafter, example embodiments of the present invention will be described. The example embodiments shall not limit the invention according to the claims, and the combinations of features described in the embodiments are not necessarily essential to the invention.

Figure 1:
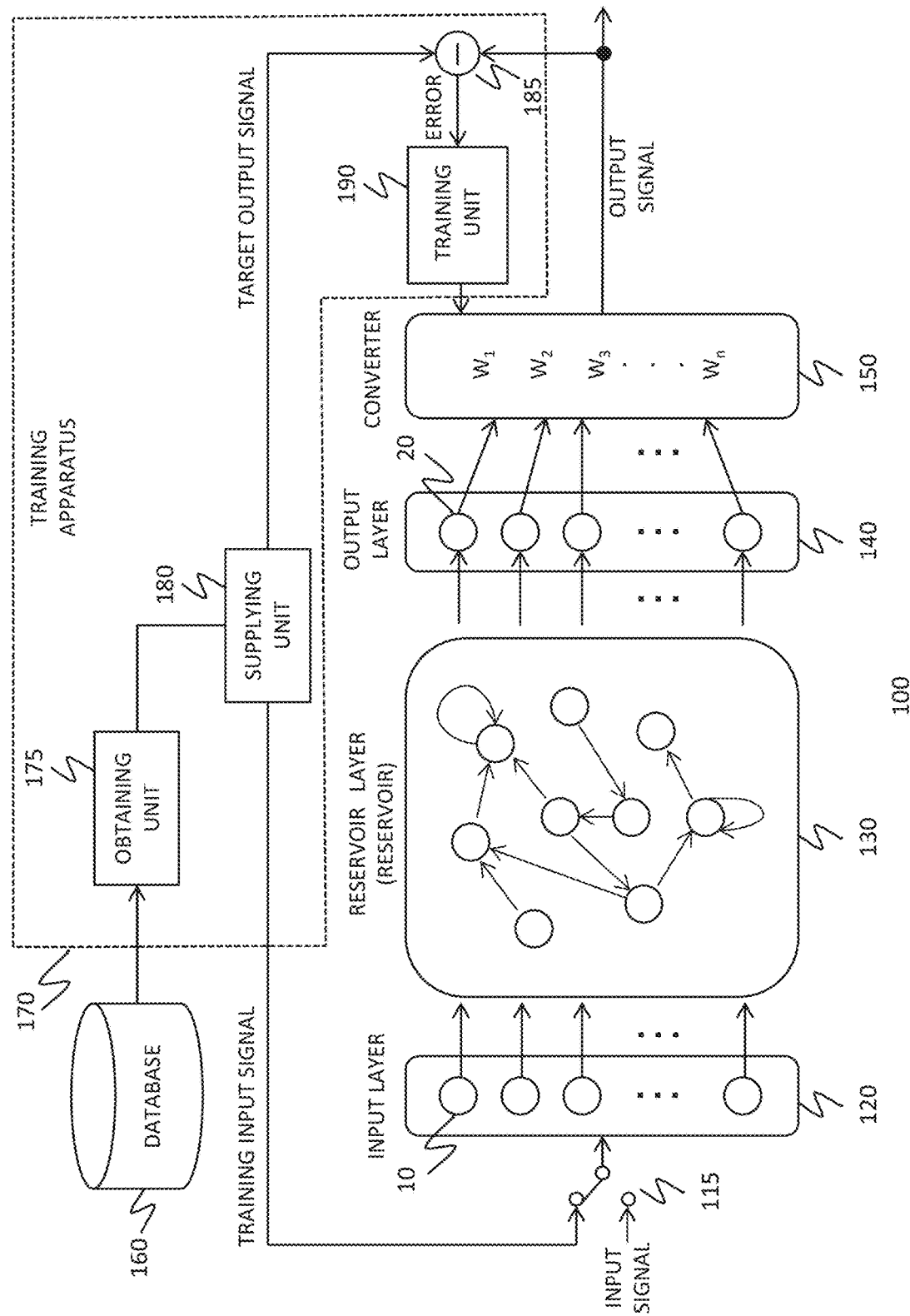
FIG. 1 shows a reservoir computing system according to an embodiment of the present invention.

FIG. 1 shows a reservoir computing system 100 according to an embodiment of the present invention. The reservoir computing system 100 may be an apparatus that performs machine learning based on training input signals, output signals, and target output signals. Based on the result of learning, the reservoir computing system 100 is operable to perform a prediction of an output signal corresponding to an input signal or convert an input signal to an output signal that represents a result of a recognition of the input signal, an expectation from the input signal, or the like. The reservoir computing system 100 includes an input selector 115, an input layer 120, a reservoir layer 130, an output layer 140, a converter 150, a database 160 and a training apparatus 170.

The input selector 115 is a selector that selects an input signal between a training input signal from the training apparatus 170 and an input signal of actual use from outside of the reservoir computing system 100, and forwards the selected input signal to the input layer 120. During the training of the reservoir computing system 100, the input selector 115 selects the training input signal from the training apparatus 170 and forwards the training input signal to the input layer 120. During the actual use of the reservoir computing system 100, the input selector 115 selects an input signal of the actual task and forwards it to the input layer 120. In this figure, the input selector 115 receives one training input signal and one input signal of the actual task. In another embodiment, the input selector 115 may receive two or more training input signals and two or more input signals of the actual task and select the training input signals or the input signals of the actual task. Here, the input signal is a time-series signal sequence such as an analog signal or a digital data sequence, in which data or signal values vary with time, such as audio data, video data, wired or wireless communication data, or the like. Furthermore, the target output signal is an accurate output signal from the training input signal.

The input layer 120 is connected to the input selector 115 and operable to receive the one or more input signals (i.e. the training input signal(s) or the input signal(s) of the actual task) from the input selector 115. The input layer 120 may include one or more input nodes 10. Each input node 10 receives the corresponding input signal selected by the input selector 115. Each input node 10 is operable to supply the reservoir layer 130 with the input signal. A weight may be set between each input node 10 and one or more corresponding nodes of the reservoir layer 130. Each input node 10 may supply an input signal that has been multiplied by the weight set for the edge between the input selector 115 and each of the one or more corresponding nodes of the reservoir layer 130. In some implementations, the one or more input nodes 10 may be virtual nodes that are defined for the purpose of representing a mathematical model of the reservoir computing system 100, or that are merely contact points of the reservoir layer 130 (e.g., physical input nodes of the reservoir layer 130 such as electrodes or optical contact points). In other embodiments, the input layer 120 may be regarded as included in the reservoir layer 130.

The reservoir layer 130 is connected to the input layer 120 and operable to output one or more inherent response signals in response to the input of the one or more input signals. The reservoir layer 130 is implemented in a physical device (i.e. a reservoir), and the reservoir layer 130 is also referred to as "a reservoir" from a perspective of physical implementation. In comparison with a neural network, the reservoir layer 130 can be regarded as having a network including a plurality of nodes. The reservoir layer 130 may have a recurrent type network structure. Each of the plurality of nodes of the reservoir layer 130 may be a nonlinear node that issues a non-linear response signal to the input signal. The plurality of nodes of the reservoir layer 130 may be virtual nodes of the reservoir layer 130. In the network including the reservoir layer 130, each of the plurality of nodes may supply other corresponding nodes with the response signal corresponding to the input signal of the node. In this case, each of the plurality of nodes may supply the other corresponding nodes with the response signal weighted by an inherent weight of the reservoir layer 130.

The output layer 140 is connected to the reservoir layer 130 and operable to receive the response signal from each node of the reservoir layer 130. The output layer 140 may include one or more output nodes 20. Each output node 20 is operable to output a value corresponding to the response signal output from the reservoir layer 130 in response to the one or more input signals. Each output node 20 is operable to output the value to the converter. A weight may be set between each output node 20 and one or more corresponding nodes of the reservoir layer 130. Each output node 20 may receive a signal that has been multiplied by the weight set for the edge between the output node 20 and each of the one or more corresponding nodes of the reservoir layer 130. In some implementations, the one or more output nodes 20 may be virtual nodes that are defined for the purpose of representing a mathematical model of the reservoir computing system 100, or that are merely contact points of the physical device of the reservoir layer 130 (e.g., physical output nodes of the reservoir layer 130 such as electrodes or optical contact points of the reservoir). In other embodiments, the output layer 140 may be explained as included in the reservoir layer 130 or the converter 150.

The converter 150 is connected to the output layer 140 and operable to convert the value from each output node 20 into the output signal. For example, the converter 150 may be an adaptive filter that applies respective weights to the corresponding value from each output node 20, and then applies a predetermined conversion function to the weighted values. As another example, the converter 150 outputs, as the output signal, the sum of the weighted values of the values from the output nodes 20. More specifically, the converter 150 outputs, as the output signal, the sum of the weighted values (e.g., $\Sigma w_n V_n$) obtained by multiplying the n values $V_n$ by the corresponding n weights ($w_1, w_2, \ldots, w_n$), where n is the number of output nodes 20. The converter 150 may further apply an activation function, such as tan h, a sigmoid function, ReLU, or the like, to the sum to obtain the output signal. The converter 150 is operable to supply the training apparatus 170 with the output signal for the purpose of training the reservoir computing system 100.

The database 160 stores one or more sets of a training input signal and a target output signal corresponding to the training input signal. The training apparatus 170 is connected to the input selector 115, the converter 150, and the database 160. The training apparatus 170 obtains each set of a training input signal and corresponding target output signal from the database 160 and trains the conversion function of the converter 150 by using the training input signal and the target output signal corresponding to the training input signal. The training apparatus 170 includes an obtaining unit 175, a supplying unit 180, a comparing unit 185, and a training unit 190.

The obtaining unit 175 is connected to the database 160 and operable to obtain the training input signal and the target output signal from the database 160. In another embodiment, the obtaining unit 175 may operable to obtain the training input signal and the target output signal by generating the training input signal and the target output signal corresponding to the training input signal by using a predetermined algorithm, a mathematical formula, or the like. For example, if the training apparatus 170 trains the reservoir computing system 100 to identify shapes of input waveforms, such as a sinusoidal waveform, a triangular waveform, and so on, then the obtaining unit 175 may generate the input waveform from a mathematical formula and generate the target output signal that represents the shape of the input waveform (e.g., a spike that identifies the shape of the input waveform).

The supplying unit 180 is connected to the obtaining unit 175. The supplying unit 180 is operable to supply the training input signal to the main part of the reservoir computing system 100 by supplying the training input signal to the reservoir layer 130 through the input selector 115 and the input layer 120, and supply the target output signal to the comparing unit 185. The comparing unit 185 is connected to the supplying unit 180 and the comparing unit 185. The comparing unit 185 receives the output signal of the converter 150 generated from the training input signal. The comparing unit 185 also receives the target output signal for the training input signal from the supplying unit 180. The comparing unit 185 compares the output signal from the converter 150 and the target output signal from the supplying unit 180. The comparing unit 185 may calculate an error or a difference between the output signal from the converter 150 and the target output signal from the supplying unit 180.

The training unit 190 is connected to the comparing unit 185 and is operable to train the conversion function to reduce an error between the output signal and the target output signal corresponding to the training input signal. The training unit 190 may set or update tunable parameters, such as weights of the converter 150, such that the output signal of the reservoir computing system 100 in response to the input signal confirms to the target output signal.

The reservoir computing system 100 described above has fixed parameters in the reservoir layer 130 and tunable parameters in the converter 150. By training the tunable parameters in the converter 150, the reservoir computing system 100 can be trained to generate accurate output signals from input signals by utilizing non-linear outputs from the reservoir layer 130 that may have a complex and even unknown structure. If a physical device having such function is used as the reservoir layer 130, computational power for calculating a large recurrent neural network (RNN) can be reduced by replacing such computation with a communication with the reservoir (i.e. the physical device of the reservoir layer 130).

The reservoir computing system 100 can be regarded as an RNN, and can be generally used in applications that are suitable for an RNN. Examples of such applications are object recognition (e.g., wave recognition, voice recognition, voice recognition or the like) and machine translation. In object recognition, the reservoir layer 130 receives the input signal corresponding to an object or representing an object through the input selector 115 and the input layer 120, and then the converter 150 outputs the output signal to represent an identification of the object. For example, in wave recognition, the reservoir computing system 100 receives a waveform as the input signal, and outputs an output signal that represents a type or an identification of waveform of the input signal. In general, the reservoir computing system 100 receives a time-series input data as the input signal and transforms the time-series input data into an output signal in a manner trained by the training apparatus 170.

Figure 2:
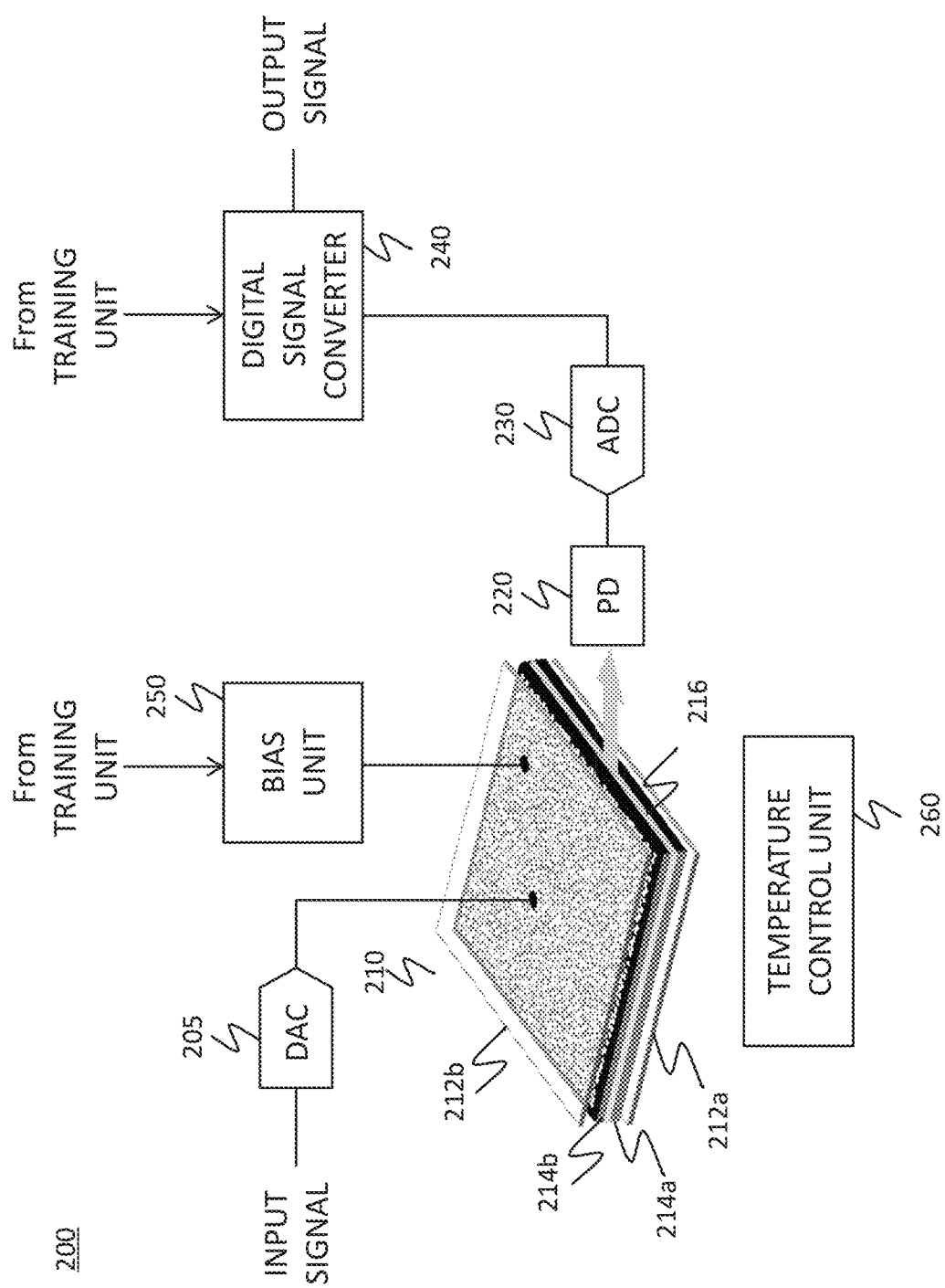
FIG. 2 shows an opto-electrical structure of a reservoir computing system according to an embodiment of the present invention.

FIG. 2 shows an opto-electrical structure 200 of a reservoir computing system according to an embodiment of the present invention. The opto-electrical structure 200 may be a part of the reservoir computing system 100 or at least a part of another reservoir computing system. While the opto-electrical structure 200 will be explained in reference to the reservoir computing system 100 and its components, the opto-electrical structure 200 can be implemented in other reservoir computing systems as well.

In this embodiment, the opto-electrical structure 200 receives a time-series digital data sequence as the input signal and outputs a time-series digital sequence as the output signal. The opto-electrical structure 200 includes a digital-analog converter (DAC) 205, a random laser 210, a photo detector (PD) 220, an analog-digital converter (ADC) 230, and a digital signal converter 240.

The DAC 205 may be an example of the input node 10 in FIG. 1. The DAC 205 receives, from an input selector such as the input selector 115, the input signal including a digital data value for each timing or each cycle in a predetermined time frame. The DAC 205 converts each digital data value to an analog value such as at each timing. In this embodiment, the DAC 205 converts each digital data value into an electric current. In this way, the DAC 205 converts the input signal into an analog wave of an electric current. In another embodiment, the DAC 205 may convert each digital data value to a different kind of analog value such as a voltage, or the like.

The random laser 210 is connected to the DAC 205. The random laser 210 emits a non-linear optical signal with respect to an input signal converted by the DAC 205. In this embodiment, the random laser 210 is a semiconductor device including an electrode 212a, a silicon substrate 214a, a laser activation layer 216, a silicon substrate 214b, and an electrode 212b. The electrode 212a is a conductive layer disposed on one surface (the bottom surface in FIG. 2) of the silicon substrate 214a. The electrode 212a is connected to a ground of the opto-electrical structure 200. The silicon substrate 214a is stacked on the electrode 212a. On the surface of the silicon substrate 214a facing the laser activation layer 216, an n-type clad layer is formed. The laser activation layer 216 is stacked on the other surface (the upper surface in FIG. 2) of the silicon substrate 214a. The silicon substrate 214b is stacked on the laser activation layer 216. On the surface of the silicon substrate 214b facing the laser activation layer 216, a p-type clad layer is formed. The electrode 212b is stacked on the silicon substrate 214b. The electrode 212b is connected to the DAC 205 and receives the analog value (i.e. an electric current) from the DAC 205. The layers including the silicon substrate 214a, a laser activation layer 216, and the silicon substrate 214b have a plurality of vias or holes at random locations. Since the random laser 210 does not have a long waveguide to transfer lights to an optical modulator, the random laser 210 can have a very small size (e.g., 10 μm$^2$).

If an electric current is provided from the DAC 205 to the electrode 212b, the laser activation layer 216 is activated to emit light. The emitted light travels in the laser activation layer 216 and are scattered by each hole. Therefore, disordered light paths are formed in the laser activation layer 216 and laser oscillations occur in such light paths. The edge of the laser activation layer 216 partially reflects the light but some light is output from the edge of the laser activation layer 216. The light output from the edge of the laser activation layer 216 is multi-mode laser light that non-linearly responds to the input analog values. An example of a random laser is explained in Hakan E. Türeci, Li Ge, et. al., "Strong interactions in multi-mode random lasers", Science 320, 643 (2008). An area of the edge of the laser activation layer 216 functions as at least part of an output node of a reservoir computing system. In other words, the random laser 210 emits a non-linear optical signal (i.e. the light output from the edge of the laser activation layer 216).

In this embodiment, a converter, such as the converter 150 in FIG. 1, includes the PD 220, the ADC 230, and the digital signal converter 240. This converter is operable to convert the non-linear optical signal from the random laser 210 into an output signal by applying a conversion function. The PD 220 faces the edge of the laser activation layer 216 in a contact or non-contact manner such that the PD 220 is positioned to receive the non-linear optical signal from the random laser 210. The PD 220 is operable to convert the non-linear optical signal to an electrical signal (e.g., a voltage signal, a current signal, etc.). In this embodiment, the PD 220 functions as at least part of an output node of a reservoir computing system.

The ADC 230 is connected to the PD 220 such that the ADC 230 detects the electrical signal from the PD 220, and is operable to convert the electrical signal detected by the PD 220 into a digital signal. The digital signal converter 240 is connected to the ADC 230 such that the digital signal converter 240 receives the electrical signal from the ADC 230, and is operable to convert the digital signal from the ADC 230 into the output signal by applying the conversion function to the digital signal. As a result of training the reservoir computing system 100, the digital signal converter 240 receives trained parameters (e.g., trained weights) of the conversion function from a training apparatus such as the training apparatus 170 and updates the conversion function with the received parameters.

In one embodiment, the opto-electrical structure 200 may also include the bias unit 250. The bias unit 250 is connected to the training apparatus 170 and operable to add bias to the input signal to be input to the random laser. In this embodiment, the training apparatus, such as the training apparatus 170, trains the bias by using the training input signal and the target output signal. The bias unit 250 receives the trained bias and supplies a constant current corresponding to the bias with the electrode 212b of the random laser 210. By training the bias of the input signal, the reservoir computing system, such as the reservoir computing system 100, can further improve the accuracy of prediction or estimation.

In one embodiment, the opto-electrical structure 200 may also include the temperature control unit 260. The temperature control unit 260 is operable to control a temperature of the random laser 210. The temperature control unit 260 may include at least one of a heater or a cooler. The temperature control unit 260 may keep the temperature of the random laser 210 constant. By controlling the temperature of the random laser 210, the temperature control unit 260 can maintain a constant operational condition of the random laser 210, which may reduce fluctuation of the optical signal output from the random laser 210.

In this embodiment, the reservoir computing system, such as the reservoir computing system 100, can implement the random laser 210 as a reservoir, supply analog values of the input signal to the electrode 212b, and convert the optical signal from the random laser 210 to the output signal. By using the random laser 210 as a reservoir, the size of the reservoir computing system can be dramatically reduced. The random laser 210, the PD 220, the ADC 230, the digital signal converter 240, and the bias unit 250 can be implemented on a single LSI circuit or a small number of LSI circuits, and such LSI circuit(s) can be mounted next to the random laser 210 on the same substrate. Furthermore, it is also possible, by using silicon-photonics (SiPh) technology, to implement the DAC 205, the random laser 210, the PD 220, the ADC 230, the digital signal converter 240, and the bias unit 250 on the same LSI circuit.

In another embodiment, the reservoir such as the physical deviced of the reservoir layer 130 may include the random laser 210 and other components. For example, the reservoir layer 130 may include optical components such as an optical waveguide, a mirror, a light absorber, a shading part, or the like.

In this embodiment, the opto-electrical structure 200 includes a single PD 220. However, an output layer in a reservoir computing system, such as the output layer 140, preferably includes a number of output nodes 20 to fully extract the complexity of the physical device of the reservoir layer 130. Therefore, in other embodiments, the opto-electrical structure 200 may include a plurality of PDs 220 receiving non-linear optical signals, each of which are emitted from a different area of the random laser 210. For example, a PD 220 may be located at each edge of the rectangular random laser 210, or an array of PDs 220 may be connected to one or more edges of the random laser 210. In this case, the opto-electrical structure 200 may also include a plurality of ADC 230, and each ADC 230 is assigned to one of the plurality of PDs 220.

In this embodiment, the input signal of the random laser 210 is an electrical signal. In another embodiment, the input signal of the random laser 210 may be an optical signal irradiating the laser activation layer 216 from the upper or lower sides of the random laser 210. In such embodiments, the opto-electrical structure 200 further includes a light emitter (e.g., an LED or a LASER) that converts the analog values from the DAC 205 into an optical signal.

In this embodiment, the output signal of the opto-electrical structure 200 is an electrical signal. In another embodiment, the digital signal converter 240 may receive the optical signal from the random laser 210, optically convert the received optical signal, and output an optical output signal. To optically convert the received optical signal, the digital signal converter 240 may include one or more light modulators that modulate the received optical signal based a modulation signal, and a training unit, such as the training unit 190, sets the modulation signal based on the result of training the reservoir computing system, such as the reservoir computing system 100.

Figure 3:
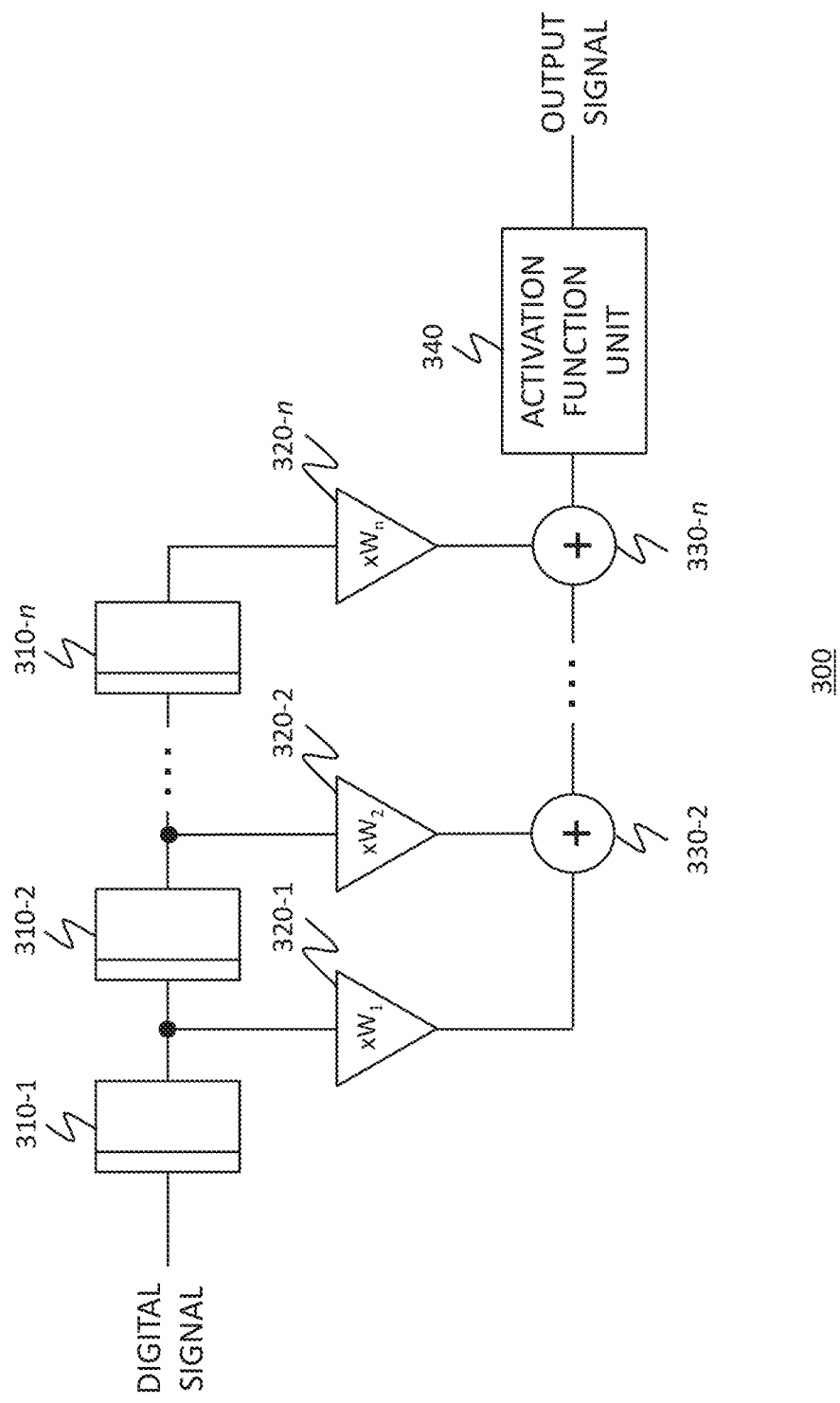
FIG. 3 shows a digital signal converter according to an embodiment of the present invention.

FIG. 3 shows a digital signal converter 300 according to an embodiment of the present invention. The digital signal converter 300 may be a detailed version of the digital signal converter 240 in FIG. 2 or may be different from the digital signal converter 240. While the digital signal converter 300 will be explained in reference to the opto-electrical structure 200 and its components, the digital signal converter 300 can be implemented in other reservoir computing system having different components as well.

The digital signal converter 300 includes a plurality of registers 310 (i.e. the register 310-1, 2, ..., n), a plurality of multipliers 320 (i.e. the multiplier 320-1, 2, ..., n), a plurality of adders 330 (i.e. the adder 330-2, ..., n), and an activation function unit 340. Here, n is the number of output nodes, such as the output node 20, in the reservoir computing system. The plurality of registers 310 is connected in a cascade manner, and the front register 310-1 receives the digital signal from an ADC such as the ADC 230. Each register 310 may be a flip-flop or a latch that can receive a digital data value from the previous stage and output the digital data value to the next stage at each clock cycle. In this way, the plurality of registers 310 can store a plurality of digital signal values at a plurality of timings, and thereby extract the plurality of digital signal values that can be regarded as the plurality of output values from the plurality of output nodes, such as output nodes 20.

The plurality of multipliers 320-1 to 320-$n$ is connected to the plurality of registers 310-1 to 310-$n$, respectively. Each multiplier 320-$k$ (k=1, ..., n) receives the digital signal value $V_k$ from the corresponding register 310-$k$, multiplies $V_k$ by a corresponding weight $w_k$, and outputs a multiplied value $w_k V_k$.

Each of the plurality of adders 330-2 to 330-$n$ is connected to one of the plurality of multipliers 320-1 to 320-$n$, and calculates the sum of the multiplied value $\Sigma w_k V_k$. In this embodiment, the plurality of adders 330-2 to 330-$n$ is connected in a cascading manner. The front adder 330-2 receives the multiplied value $w_1 V_1$ from the multiplier 320-1 and the multiplied value $w_2 V_2$ from the multiplier 320-2, adds the multiplied values $w_1 V_1$ and $w_2 V_2$, and forwards the added value (i.e. an intermediate sum $w_1 V_1 + w_2 V_2$) to the adder 330-3 at the next stage. Each adder 330-$k$ (k=3, ..., n-1) receives the intermediate sum from the previous stage and the multiplied value $w_k V_k$ from the multiplier 320-$k$, adds the multiplied value $w_k V_k$ to the intermediate sum, and forwards the intermediate sum to the next stage. The adder 330-$n$ receives the intermediate sum from the previous stage and the multiplied value $w_n V_n$ from the multiplier 320-$n$, adds the multiplied value $w_n V_n$ to the intermediate sum, and forwards the sum $\Sigma w_n V_n$ to the activation function unit 340.

The activation function unit 340 is connected to the adder 330-$n$, and calculates the values of the output signal by applying an activation function (e.g., tan h, sigmoid, ReLU) to $\Sigma w_n V_n$. In this way, the digital signal converter 300 is operable to calculate a weighted sum $\Sigma w_n V_n$ of time-series values of the digital signal from the ADC 230 using a plurality of trained weights $w_1$ to $w_n$, and to output the output signal based on the weighted sum $\Sigma w_n V_n$. By using the time-series values of the digital signal from the ADC 230, the digital signal converter 300 can extract the complexity of the random laser 210 from one or a small number of non-linear optical signals from the random laser 210.

Figure 4:
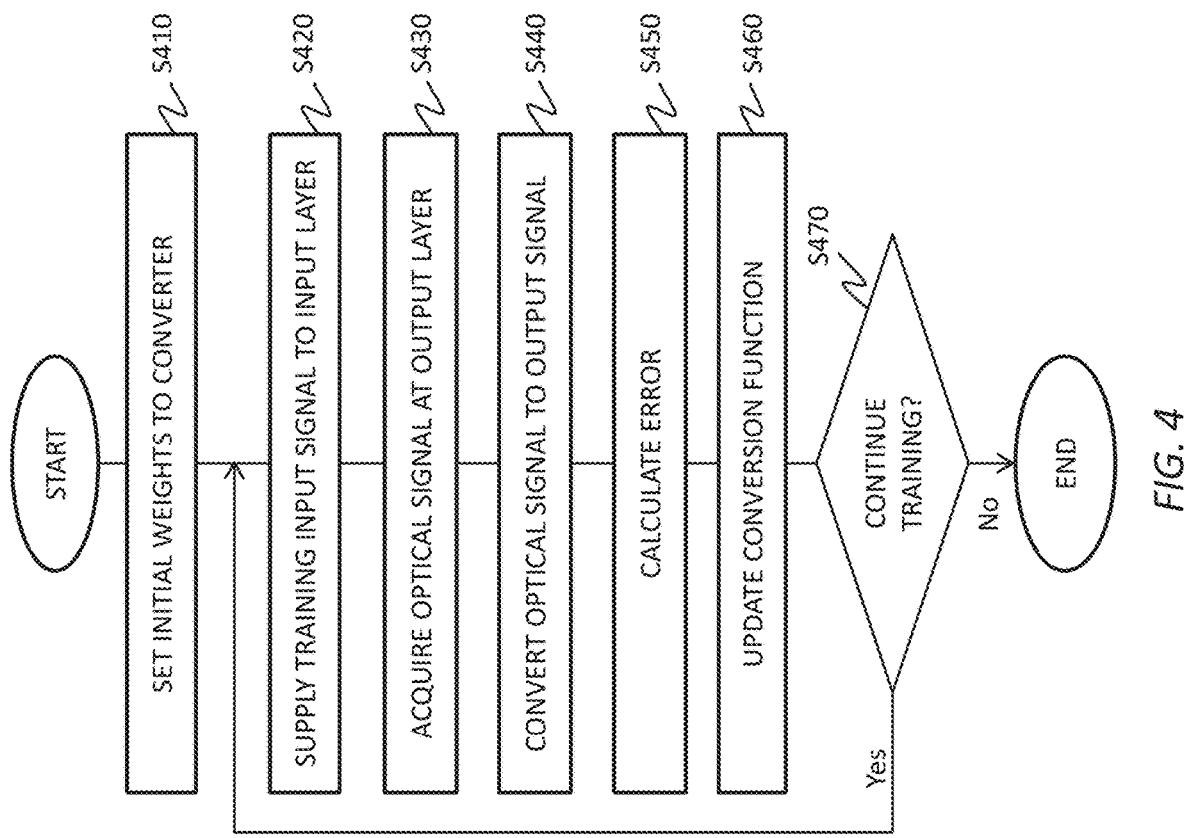
FIG. 4 shows an operational flow of training a reservoir computing system according to an embodiment of the present invention.

FIG. 4 shows an operational flow of training a reservoir computing system according to an embodiment of the present invention. The operations of FIG. 4 can be performed by, for example, the reservoir computing system 100 and its components that were explained in reference to FIG. 1. The operations of FIG. 4 can also be performed by a reservoir computing system including the opto-electrical structure 200 in FIG. 2. While the operational flow of FIG. 4 will be explained in reference to the reservoir computing system 100 including the opto-electrical structure 200 and their components, the operational flow can be performed by other apparatus having different components as well.

At S410 (block 410), the training unit 190 sets initial weights of $w_1$ to $w_n$ to the converter 150. The training unit 190 may set a random value to each weight of $w_1$ to $w_n$.

At S420, the obtaining unit 175 obtains a set of the training input signal and the target output signal from the database 160 and the supplying unit 180 supplies the training input signal to the input layer 120 through the input selector 115. The physical device of the reservoir layer 130 outputs an optical signal with respect to the training input signal.

At S430, the output layer 140 acquires the optical signal from the reservoir layer 130 at the PD such as the PD 220. At S440, the converter 150, which may include the PD 220, the ADC 230, and the digital signal converter 240, converts the optical signal into the output signal of the reservoir computing system 100.

At S450, the comparing unit 185 calculates an error or a difference of the output signal from the converter 150 from the target output signal from the supplying unit 180. The comparing unit 185 may calculate a mean squared error between the output signal from the converter 150 and the target output signal.

At S460, the training unit 190 updates the conversion function to reduce an error between the output signal and the target output signal corresponding to the training input signal. The training unit 190 may update the weights $w_1$ to $w_n$ by using backpropagation, gradient descent, or any other training algorithm.

At S470, the training apparatus 170 determines whether or not to continue the training. The training apparatus 170 repeats S420 to S460 if the training apparatus 170 determines to continue the training. The training apparatus 170 may use a different set of the training input signal and the target output signal for each iteration. The training apparatus 170 may also use the same set of the training input signal and the target output signal for each iteration to gradually update the conversion function. The training apparatus 170 completes the training if the training apparatus 170 determines to finish the training at S470.

In some embodiments in which training apparatus 170 also trains parameters different from the weights of the converter 150, the training apparatus 170 may perform the operational flow of FIG. 4 for each setting of such parameters and select the best setting that has the highest accuracy. For example, the training apparatus 170 may perform the operational flow of FIG. 4 for different bias values of the bias unit 250 (e.g., the bias current of 0 mA, 1 mA, 2 mA, ..., and so on), and select the best bias value that caused the highest accuracy for the performance test. The training apparatus 170 may also perform the operational flow of FIG. 4 for selecting the best temperature setting of the temperature control unit 260.

Trained reservoir computing system 100 is applied to actual tasks such as identifying an object. In actual use, an input signal corresponding to an object is supplied to the reservoir layer 130 through the input layer 120 in the same way as S420. The non-linear optical signal from the reservoir layer 130 is acquired by the output layer 140 in the same way as S430. The non-linear optical signal is converted, by the converter 150, into an output signal by applying a conversion function in the same way as S440. Then, an apparatus that receives the output signal converted by the converter 150 recognizes or identifies the object by using the output signal.

Although FIG. 4 shows a basic operational flow of training the reservoir computing system 100, the training apparatus 170 may use other algorithms. For example, the training apparatus 170 may calculate errors for two or more sets (i.e. a batch or a mini-batch) of the training input signals and the target output signals by repeating S420 to S450, and update the conversion function of the converter 150 based on the errors corresponding to the two or more sets at the same time. The training apparatus 170 may adopt the cross-validation method that uses some sets of the training input signals and the target output signals to test the accuracy of the reservoir computing system 100.

In actual use after the training, the reservoir computing system 100 may perform S420 to S440 for each input signal from outside of the reservoir computing system 100 (e.g., an input signal to be classified, a waveform to be identified, and so on). The reservoir computing system 100 may continue the training (i.e. on-line training) during the actual use.

Figure 5:
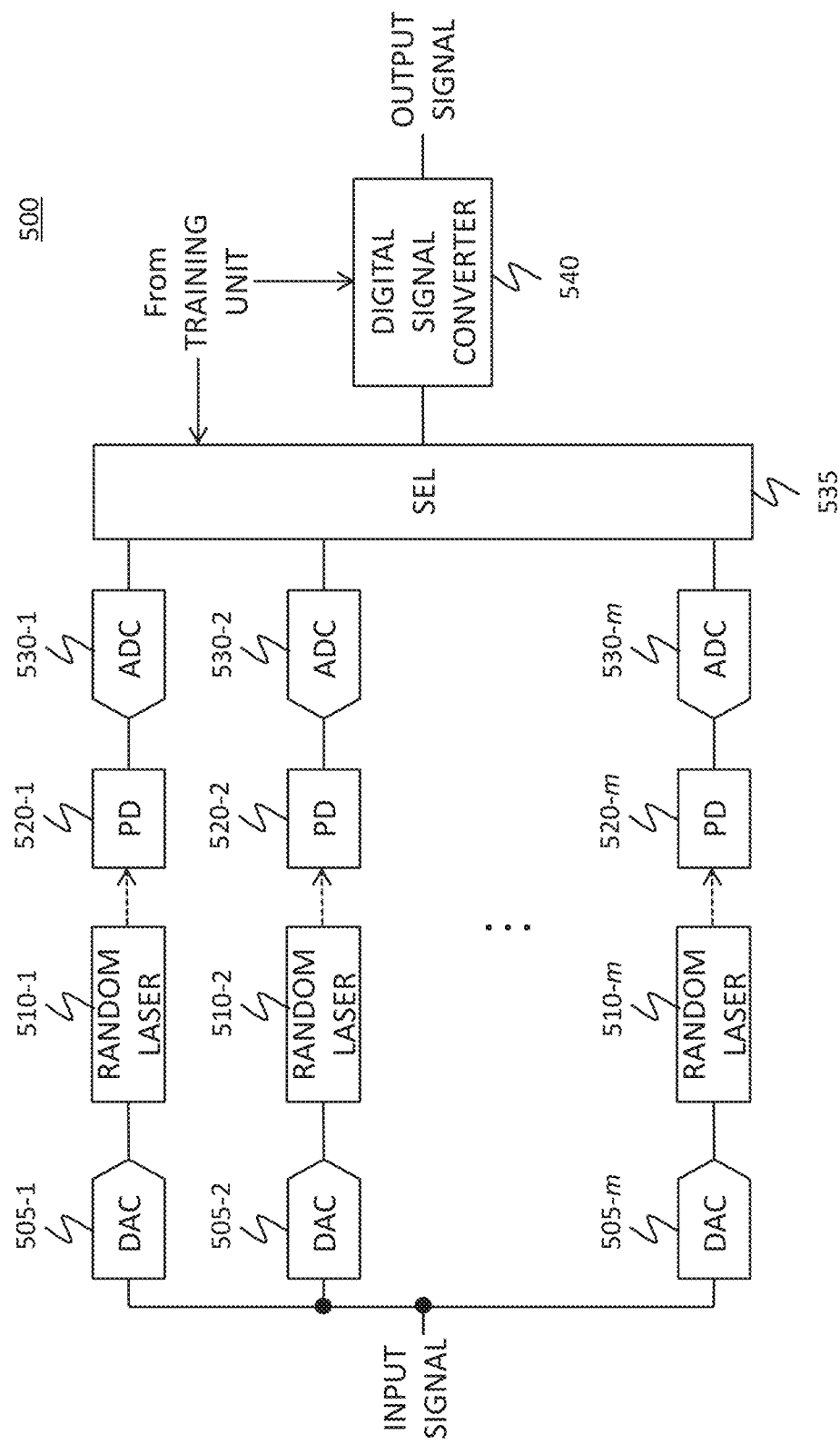
FIG. 5 shows an opto-electrical structure of a reservoir computing system according to an embodiment of the present invention.

FIG. 5 shows an opt-electrical structure 500 of a reservoir computing system according to an embodiment of the present invention. The opto-electrical structure 500 may be a detailed version of the digital signal converter 240 in FIG. 2 or may be different from the digital signal converter 240. While the opto-electrical structure 500 will be explained in reference to the opto-electrical structure 200 and its components, the opt-electrical structure 500 can be implemented in other reservoir computing system having different components as well.

The opt-electrical structure 500 includes a plurality of instances of the random laser 510-1 to 510-$m$ and a training apparatus, such as the training apparatus 170, selects a random laser that has the highest accuracy after training. In this embodiment, the opto-electrical structure 500 includes a plurality of DACs 505-1 to 505-$m$, a plurality of random lasers 510-1 to 510-$m$, a plurality of PDs 520-1 to 520-$m$, a plurality of ADCs 530-1 to 530-$m$, a reservoir selector 535, and a digital signal converter 540.

Each DAC 505-$k$ (k=1, 2, . . . , m) is operable to receive the input signal and convert the input signal to an analog wave of an electric current. Since each DAC 505-$k$ is same or very similar to the DAC 205 in FIG. 2, detailed explanations that are same to the DAC 205 are omitted.

Each random laser 510-$k$ is connected to the corresponding DAC 505-$k$. The random laser 510-$k$ is operable to emit a non-linear optical signal with respect to the input signal converted by the DAC 505-$k$. Each of the random lasers 510-1 to 510-$m$ may have a plurality of holes at different locations, and thereby emits an optical signal different from optical signals emitted by other random lasers. Since each random laser 510-$k$ is the same or very similar to the random laser 210 in FIG. 2, detailed explanations that are same to the random laser 210 are omitted.

Each PD 520-$k$ is connected to the corresponding the random laser 510-$k$. Each PD 520-$k$ is operable to convert the non-linear optical signal emitted from the random laser 510-$k$ into an electrical signal. Since each PD 520-$k$ is same or very similar to the PD 220 in FIG. 2, detailed explanations that are same to the PD 220 are omitted.

Each ADC 530-$k$ is connected to the corresponding the PD 520-$k$. Each ADC 530-$k$ is operable to convert the electrical signal detected by the PD 520-$k$ into a digital signal. Since each ADC 530-$k$ is the same or very similar to the ADC 230 in FIG. 2, detailed explanations that are the same as the ADC 230 are omitted.

The reservoir selector 535 is connected to the plurality of ADC 530-1 to 530-$m$. The reservoir selector 535 is operable to select a random laser, from among the plurality of instances of the random laser 510-1 to 510-$m$, that is to be used to emit the non-linear optical signal to be converted to the output signal. The reservoir selector 535 may select a digital signal originated from the selected the random laser 510 and forward the selected digital signal to the digital signal converter 540.

The digital signal converter 540 is connected to the reservoir selector 535. The digital signal converter 540 is operable to convert the selected digital signal from the reservoir selector 535 to the output signal by applying the conversion function to the digital signal. Since the digital signal converter 540 is the same or very similar to the digital signal converter 240 in FIG. 2, detailed explanations that are the same as the digital signal converter 240 are omitted. The opt-electrical structure 500 may also include a bias unit such the bias unit 250 in FIG. 2 for each the random laser 510-$k$.

In a reservoir computing system including the opto-electrical structure 500, a training apparatus, such as the training apparatus 170, trains the reservoir selector 535 to select a random laser 510, from among the plurality of instances of the random laser 510-1 to 510-$m$, based on the accuracy of each random laser 510-$k$ as a result of training the digital signal converter 540 with each random laser 510-$k$. For example, the training apparatus 170 trains the opto-electrical structure 500 in a configuration that the random laser 510-1 is selected, trains the opto-electrical structure 500 in a configuration that the random laser 510-2 is selected, and trains the opto-electrical structure 500 in a configuration that the random laser 510-$m$ is selected. The optimal parameter set for each configuration may be different. Then the training apparatus 170 selects the best or most preferable configuration to be applied in the actual use of the reservoir computing system, such as the reservoir computing system 100.

In this way, the training apparatus 170 can improve the accuracy of the reservoir computing system 100 for a specific application of the reservoir computing system 100. Since the response of each random laser 510-$k$ may be different, each random laser 510-$k$ may have different abilities for the same application. By implementing a plurality of random lasers 510-1 to 510-$m$, the reservoir computing system 100 can be more useful as a general purpose reservoir computing system.

Figure 6:
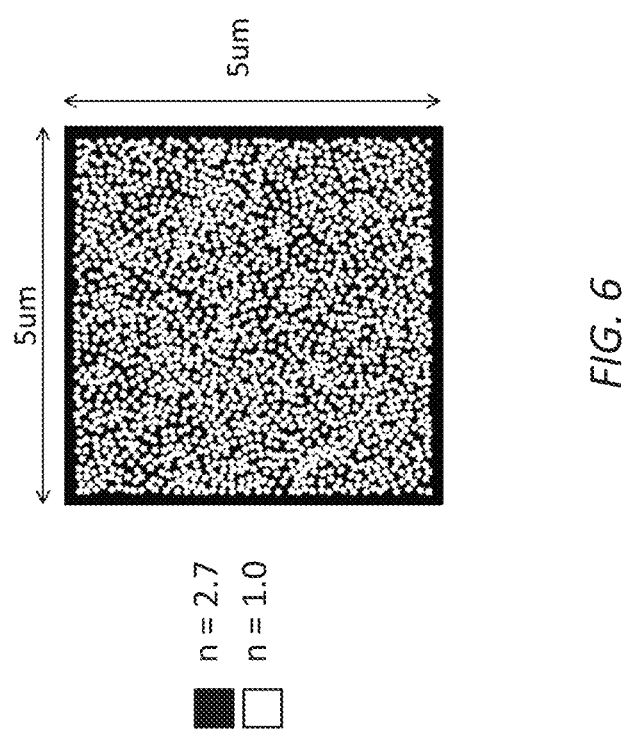
FIG. 6 shows an example of a random structure of a random laser for a simulation.

FIG. 6 shows an example of a random structure of a random laser for a simulation. In this simulation, a reservoir computing system including a random laser and a converter is simulated. The simulated random laser has a size of 5 μm×5 μm, and the simulated random pattern is shown in FIG. 6.

The simulation is performed by coupling FDTD (Finite Difference Time Domain) method and rate equations. The FDTD is an equation set describing light scattering dynamics. The rate equations describe laser dynamics (photon-electron interaction).

In the simulation, a wave classification task for classifying triangular/sinusoidal waves is performed. In the wave classification task, triangular/sinusoidal waves having different wavelengths or frequencies are classified by a reservoir computing system. The reservoir computing system is trained by using 200 training input signals (100 sinusoidal waveforms and 100 triangular waveforms). Each input signal has different wavelength randomly distributed around the center wavelength.

Figure 7:
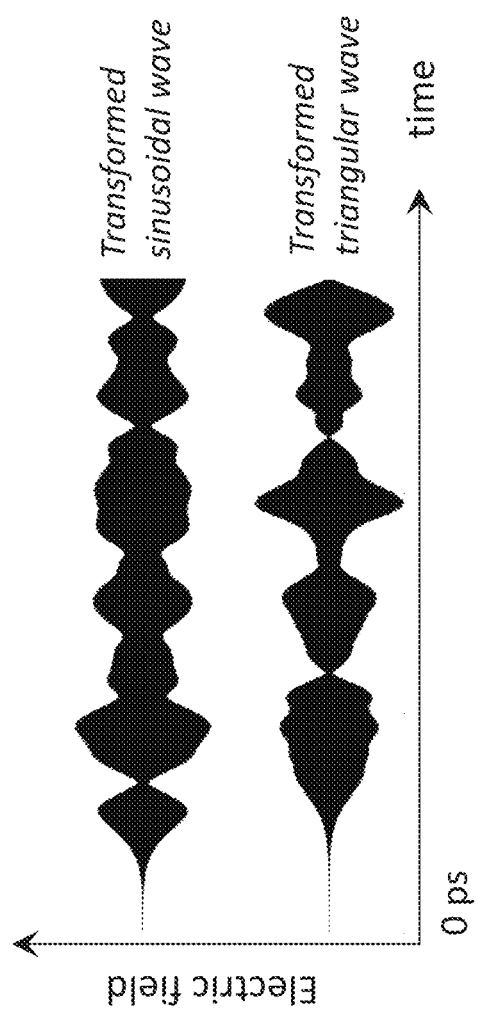
FIG. 7 shows simulated waveforms transformed by the simulated reservoir computing system having the random structure of FIG. 6.

FIG. 7 shows simulated waveforms transformed by the simulated reservoir computing system having the random structure of FIG. 6. For comparing the two waveforms, the transformed sinusoidal waveform is vertically shifted in FIG. 7.

As shown in FIG. 7, the converter of the simulated reservoir computing system can output the transformed sinusoidal waveform and the transformed triangular waveform having different shapes that are easy to classify. The minimum error rate of the classification was not more than 10% in the simulated reservoir system. The minimum error rate was 27% in the case in which the non-linear transformation of the random laser was not used. This result shows the improvement of the accuracy for a classification task by using a random laser in a reservoir computing system.

Various embodiments of the present invention may be described with reference to flowcharts and block diagrams whose blocks may represent (1) steps of processes in which operations are performed or (2) sections of apparatuses responsible for performing operations. Certain steps and sections may be implemented by dedicated circuitry, programmable circuitry supplied with computer-readable instructions stored on computer-readable media, and/or processors supplied with computer-readable instructions stored on computer-readable media. Dedicated circuitry may include digital and/or analog hardware circuits and may include integrated circuits (IC) and/or discrete circuits. Programmable circuitry may include reconfigurable hardware circuits including logical AND, OR, XOR, NAND, NOR, and other logical operations, flip-flops, registers, memory elements, etc., such as field-programmable gate arrays (FPGA), programmable logic arrays (PLA), etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 8:
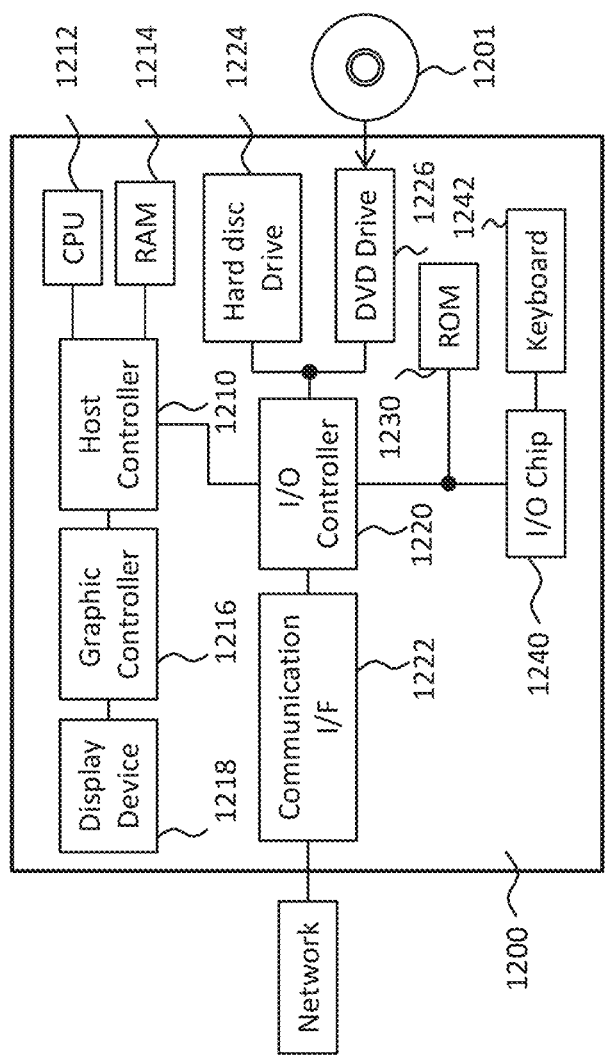
FIG. 8 shows an exemplary hardware configuration of a computer according to an embodiment of the present invention.

FIG. 8 shows an example of a computer 1200 in which aspects of the present invention may be wholly or partly embodied. A program that is installed in the computer 1200 can cause the computer 1200 to function as or perform operations associated with apparatuses of the embodiments of the present invention or one or more sections thereof, and/or cause the computer 1200 to perform processes of the embodiments of the present invention or steps thereof. Such a program may be executed by the CPU 1212 to cause the computer 1200 to perform certain operations associated with some or all of the blocks of flowcharts and block diagrams described herein.

The computer 1200 according to the present embodiment includes a CPU 1212, a RAM 1214, a graphics controller 1216, and a display device 1218, which are mutually connected by a host controller 1210. The computer 1200 also includes input/output units such as a communication interface 1222, a hard disk drive 1224, a DVD-ROM drive 1226 and an IC card drive, which are connected to the host controller 1210 via an input/output controller 1220. The computer also includes legacy input/output units such as a ROM 1230 and a keyboard 1242, which are connected to the input/output controller 1220 through an input/output chip 1240.

The CPU 1212 operates according to programs stored in the ROM 1230 and the RAM 1214, thereby controlling each unit. The graphics controller 1216 obtains image data generated by the CPU 1212 on a frame buffer or the like provided in the RAM 1214 or in itself, and causes the image data to be displayed on the display device 1218.

The communication interface 1222 communicates with other electronic devices via a network. The hard disk drive 1224 stores programs and data used by the CPU 1212 within the computer 1200. The DVD-ROM drive 1226 reads the programs or the data from the DVD-ROM 1201, and provides the hard disk drive 1224 with the programs or the data via the RAM 1214. The IC card drive reads programs and data from an IC card, and/or writes programs and data into the IC card.

The ROM 1230 stores therein a boot program or the like executed by the computer 1200 at the time of activation, and/or a program depending on the hardware of the computer 1200. The input/output chip 1240 may also connect various input/output units via a parallel port, a serial port, a keyboard port, a mouse port, and the like to the input/output controller 1220.

A program is provided by computer readable media such as the DVD-ROM 1201 or the IC card. The program is read from the computer readable media, installed into the hard disk drive 1224, RAM 1214, or ROM 1230, which are also examples of computer readable media, and executed by the CPU 1212. The information processing described in these programs is read into the computer 1200, resulting in cooperation between a program and the above-mentioned various types of hardware resources. An apparatus or method may be constituted by realizing the operation or processing of information in accordance with the usage of the computer 1200.

For example, when communication is performed between the computer 1200 and an external device, the CPU 1212 may execute a communication program loaded onto the RAM 1214 to instruct communication processing to the communication interface 1222, based on the processing described in the communication program. The communication interface 1222, under control of the CPU 1212, reads transmission data stored on a transmission buffering region provided in a recording medium such as the RAM 1214, the hard disk drive 1224, the DVD-ROM 1201, or the IC card, and transmits the read transmission data to a network or writes reception data received from a network to a reception buffering region or the like provided on the recording medium.

In addition, the CPU 1212 may cause all or a necessary portion of a file or a database to be read into the RAM 1214, the file or the database having been stored in an external recording medium such as the hard disk drive 1224, the DVD-ROM drive 1226 (DVD-ROM 1201), the IC card, etc., and perform various types of processing on the data on the RAM 1214. The CPU 1212 may then write back the processed data to the external recording medium.

Various types of information, such as various types of programs, data, tables, and databases, may be stored in the recording medium to undergo information processing. The CPU 1212 may perform various types of processing on the data read from the RAM 1214, which includes various types of operations, processing of information, condition judging, conditional branch, unconditional branch, search/replace of information, etc., as described throughout this disclosure and designated by an instruction sequence of programs, and writes the result back to the RAM 1214. In addition, the CPU 1212 may search for information in a file, a database, etc., in the recording medium. For example, when a plurality of entries, each having an attribute value of a first attribute associated with an attribute value of a second attribute, are stored in the recording medium, the CPU 1212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The above-explained program or software modules may be stored in the computer readable media on or near the computer 1200. In addition, a recording medium such as a hard disk or a RAM provided in a server system connected to a dedicated communication network or the Internet can be used as the computer readable media, thereby providing the program to the computer 1200 via the network.

While the embodiments of the present invention have been described, the technical scope of the invention is not limited to the above described embodiments. It will be apparent to persons skilled in the art that various alterations and improvements can be added to the above-described embodiments. It should also apparent from the scope of the claims that the embodiments added with such alterations or improvements are within the technical scope of the invention.

Many of the embodiments of the present invention include artificial intelligence, and include neural networks in particular. Some of the foregoing embodiments describe specific types of neural networks. However, a neural network usually starts as a configuration of random values. Such untrained neural networks must be trained before they can be reasonably expected to perform a function with success. Once trained, a neural network may not require further training. In this way, a trained neural network is a product of the process of training an untrained neural network.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A reservoir computing system comprising:
   a reservoir including a plurality of instances of a random laser for emitting non-linear optical signals with respect to an input signal; and
   a converter for converting a non-linear optical signal into an output signal by applying a conversion function,
   wherein the converter includes a reservoir selector for selecting a particular random laser, from among the plurality of instances of the random laser, that is to be used to emit the non-linear optical signal to be converted to the output signal.

2. The reservoir computing system of claim 1, wherein the conversion function is trained by using a training input signal and a target output signal.

3. The reservoir computing system of claim 1, wherein the input signal is an electrical signal.

4. The reservoir computing system of claim 1, wherein the input signal is an optical signal.

5. The reservoir computing system of claim 1, wherein the output signal is an electrical signal.

6. The reservoir computing system of claim 5, wherein the converter includes:
   a photo detector for converting the non-linear optical signal into an electrical signal;
   an AD converter for converting the electrical signal detected by the photo detector into a digital signal; and
   a digital signal converter for converting the digital signal from the AD converter into the output signal by applying the conversion function to the digital signal.

7. The reservoir computing system of claim 6, wherein the converter includes a plurality of photo detectors receiving non-linear optical signals each of which are emitted from a different area of the random laser.

8. The reservoir computing system of claim 6, wherein the digital signal converter calculates a weighted sum of time-series values of the digital signal using a plurality of trained weights.

9. The reservoir computing system of claim 1, further comprising a training apparatus for training the conversion function of the converter by using the training input signal and the target output signal.

10. The reservoir computing system of claim 9, further comprising a bias unit for adding bias to the input signal to be input to the random laser, and
    wherein the training apparatus trains the bias by using the training input signal and the target output signal.

11. The reservoir computing system of claim 10, wherein the training apparatus trains the reservoir selector to select a random laser, from among the plurality of instances of the random laser, based on the accuracy of each random laser.

12. The reservoir computing system of claim 1, further comprising a temperature control unit for controlling a temperature of the random laser.

13. A method comprising:
    supplying an input signal corresponding to an object to a reservoir including a plurality of instances of a random laser for emitting non-linear optical signals with respect to the input signal;
    converting the non-linear optical signal into an output signal by applying a conversion function; and
    identifying the object by using the output signal,
    wherein said converting step includes using a reservoir selector included in a converter performing said converting step to select a particular random laser, from among the plurality of instances of the random laser, that is to be used to emit the non-linear optical signal to be converted to the output signal.

14. A training apparatus comprising:
    an obtaining unit for obtaining a training input signal and a target output signal;
    a supplying unit for supplying the training input signal to a reservoir computing system, wherein the reservoir computing system includes a random laser for emitting a non-linear optical signal with respect to an input signal and a converter for converting the non-linear optical signal into an output signal by applying a conversion function; and
    a training unit for training the conversion function to reduce an error between the output signal and the target output signal corresponding to the training input signal.

15. The training apparatus of claim 14, wherein
    the reservoir computing system further includes a bias unit for adding bias to the input signal to be input to the random laser, and
    the training unit further trains the bias by using the training input signal and the target output signal.

16. The training apparatus of claim 14, wherein
    the reservoir computing system further includes a plurality of instances of the random laser,
    the converter includes a reservoir selector for selecting a random laser, from among the plurality of instances of the random laser, that is to be used to emit the non-linear optical signal to be converted to the output signal, and the training unit trains the reservoir selector to select a random laser from among the plurality of instances of the random laser based on the accuracy of each random laser.

17. The training apparatus of claim 14, wherein the reservoir receives the input signal corresponding to an object and the converter outputs the output signal to represent an identification of the object.

18. A computer-implemented method comprising:

obtaining a training input signal and a target output signal;

supplying the training input signal to a reservoir computing system, wherein the reservoir computing system includes a random laser for emitting a non-linear optical signal with respect to an input signal and a converter for converting the non-linear optical signal to an output signal by applying a conversion function; and training the conversion function to reduce an error between the output signal and the target output signal corresponding to the training input signal.

19. The computer-implemented method of claim 18, wherein the reservoir computing system further includes a bias unit for adding bias to the input signal to be input to the random laser, and the training includes training the bias by using the training input signal and the target output signal.

20. The computer-implemented method of claim 18, wherein the reservoir computing system further includes a plurality of instances of the random laser, the converter includes a selector for selecting a random laser, from among the plurality of instances of the random laser, that is to be used to emit the non-linear optical signal to be converted to the output signal, and the training includes training the reservoir selector to select a random laser from among the plurality of instances of the random laser based on the accuracy of each random laser.

21. The computer-implemented method of claim 18, wherein the reservoir receives the input signal corresponding to an object and the converter outputs the output signal to represent an identification of the object.

22. A computer program product including one or more computer readable storage mediums collectively storing program instructions that are executable by a processor or programmable circuitry to cause the processor or programmable circuitry to perform operations comprising:

obtaining a training input signal and a target output signal;

supplying the training input signal to a reservoir computing system, wherein the reservoir computing system includes a random laser for emitting non-linear optical signal with respect to an input signal and a converter for converting the non-linear optical signal to an output signal by applying a conversion function; and training the conversion function to reduce an error between the output signal and the target output signal corresponding to the training input signal.

23. The computer program product of claim 22, wherein the reservoir computing system further includes a bias unit for adding bias to the input signal to be input to the random laser, and the training includes further training the bias by using the training input signal and the target output signal.

24. The computer program product of claim 22, wherein the reservoir computing system further includes a plurality of instances of the random laser and the converter includes a reservoir selector for selecting a random laser, from among the plurality of instances of the random laser, that is to be used to emit the non-linear optical signal to be converted to the output signal, and the training includes further training the reservoir selector to select a random laser from among the plurality of instances of the random laser based on the accuracy of each random laser.

\* \* \* \* \*